United States Patent
Goeke et al.

(10) Patent No.: US 11,085,951 B2
(45) Date of Patent: Aug. 10, 2021

(54) NON-LINEAR ACTIVE SHUNT AMMETER

(71) Applicant: Keithley Instruments, LLC, Solon, OH (US)

(72) Inventors: Wayne C. Goeke, Hudson, OH (US); James A. Niemann, Chagrin Falls, OH (US)

(73) Assignee: Keithley Instruments, LLC, Solon, OH (US)

( * ) Notice: Subject to any disclaimer, the term of this patent is extended or adjusted under 35 U.S.C. 154(b) by 60 days.

(21) Appl. No.: 16/401,470

(22) Filed: May 2, 2019

(65) Prior Publication Data

US 2019/0339305 A1 Nov. 7, 2019

Related U.S. Application Data

(60) Provisional application No. 62/666,510, filed on May 3, 2018.

(51) Int. Cl.
*G01R 15/14* (2006.01)
*H03F 3/45* (2006.01)
*G01R 19/00* (2006.01)

(52) U.S. Cl.
CPC ....... *G01R 15/146* (2013.01); *G01R 19/0092* (2013.01); *H03F 3/45071* (2013.01); *H03F 2200/129* (2013.01); *H03F 2200/144* (2013.01); *H03F 2200/228* (2013.01); *H03F 2200/462* (2013.01); *H03F 2203/45116* (2013.01); *H03F 2203/45518* (2013.01); *H03F 2203/45526* (2013.01); *H03F 2203/45528* (2013.01)

(58) Field of Classification Search
CPC .. G01R 15/146; G01R 19/0092; G01R 15/09; H03F 3/45071; H03F 2200/129; H03F 2200/144; H03F 2200/228; H03F 2203/45518; H03F 2200/462; H03F 2203/45116; H03F 2203/45526; H03F 2203/45528
USPC ................... 324/123 R, 76.11, 330
See application file for complete search history.

(56) References Cited

U.S. PATENT DOCUMENTS

| | | | |
|---|---|---|---|
| 8,405,455 B2* | 3/2013 | Coupland | ............. H03F 1/3211 330/86 |
| 2004/0070446 A1* | 4/2004 | Krupka | ..................... H03F 1/30 330/69 |
| 2012/0249235 A1* | 10/2012 | Zare-Hoseini | ........... H03G 1/04 330/86 |

(Continued)

*Primary Examiner* — Giovanni Astacio-Oquendo
(74) *Attorney, Agent, or Firm* — Miller Nash Graham & Dunn; Andrew J. Harrington (57) ABSTRACT

A feedback ammeter, which may be included in a source measure unit or a digital multi-meter, for example, including an operational amplifier having an input and an output and a feedback path electrically coupled between the output and the input of the operational amplifier. The feedback path includes a first non-linear device to allow the measurement of decades of current. The ammeter also includes an amplifier electrically coupled to the input of the operational amplifier and the output of the operational amplifier, a second non-linear device electrically coupled to an output of the amplifier, and a resistor electrically coupled between the second capacitor and the input of the operational amplifier. A constant resistance input impedance is established using the second non-linear device that can adjust the circuit gain.

19 Claims, 11 Drawing Sheets

(56) References Cited

U.S. PATENT DOCUMENTS

| | | | |
|---|---|---|---|
| 2018/0003741 A1* | 1/2018 | Goeke | G01R 1/203 |
| 2018/0025612 A1* | 1/2018 | Tan | G08B 5/38 |
| | | | 340/637 |
| 2018/0123441 A1* | 5/2018 | Yanai | F16H 61/0006 |
| 2019/0329033 A1* | 10/2019 | Li | H02M 1/00 |
| 2020/0041546 A1* | 2/2020 | Liberty | G01R 19/257 |

* cited by examiner

Fig. 1

PRIOR ART

Fig. 2

PRIOR ART

NON-LINEAR ACTIVE SHUNT AMMETER

PRIORITY

This disclosure claims benefit of U.S. Provisional Application No. 62/666,510, titled "Diode Active Shunt," filed on May 3, 2018, which is incorporated herein by reference in its entirety.

TECHNICAL FIELD

The disclosed technology relates generally to electrical measurement equipment and, more particularly, to active shunt ammeters for use in measuring electrical current.

BACKGROUND

Source measure units (SMUs) are used to make precision measurements in many fields, including the testing of semiconductor products. Typical SMU designs include a voltage or electrical current source with integrated voltage and electrical current measurement capabilities. A device under test (DUT) can be coupled to the SMU and then stimulated with either the voltage or electrical current source. There are several ways in which the electrical current through a DUT may be measured. For example, a shunt ammeter may be used to simply sense the voltage across a resistor. However, the resistance must be kept small so as to not cause a large burden voltage to the input signal. A low noise gain stage is required to amplify the burden voltage so it can be measured.

A feedback ammeter generally uses a high gain operational amplifier (op-amp) to pull the input circuit through a resistor. The op-amp keeps the burden voltage low because of its high DC gain (e.g., typically greater than 1 million). This allows the resistance to be larger, thus allowing the output signal to be larger. However, the high gain of the op-amp begins to roll off at relatively low frequencies, causing the burden voltage to increase at higher frequencies as well. If the input is capacitive, it can cause the feedback ammeter to ring or even oscillate.

Embodiments of the disclosure address these and other deficiencies of the prior art.

DETAILED DESCRIPTION

Figure 1:
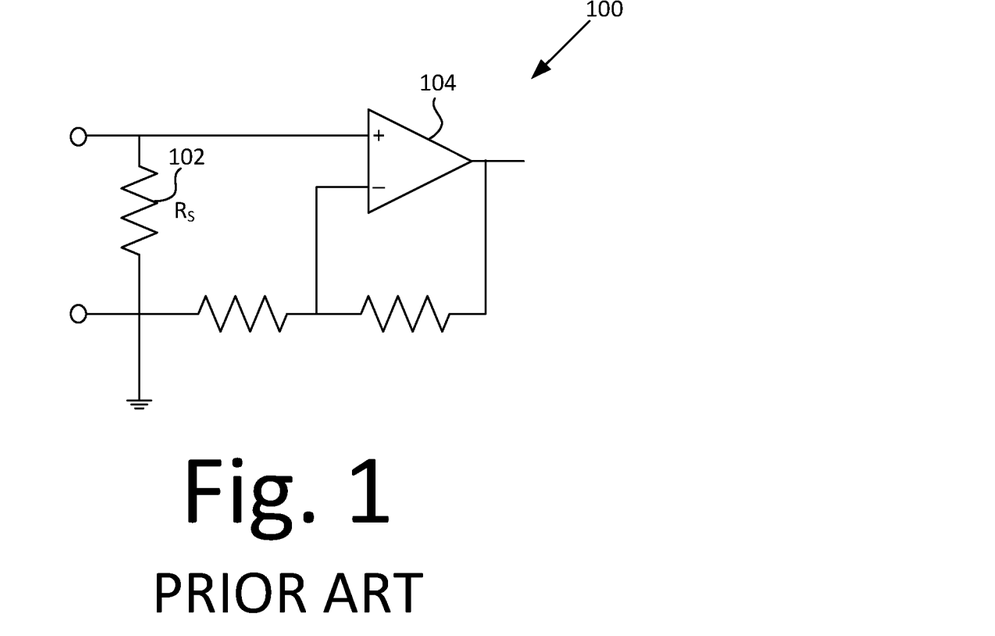
FIG. 1 illustrates an example of a conventional shunt ammeter configured to simply sense the voltage across a resistor $R_S$.

Implementations of the disclosed technology relate generally to electrical measurement equipment and, in particular, to active shunt ammeter circuit designs for use in measuring electrical current. Such ammeters are often a sub-component of measurement products including digital multi-meters (DMMs) and source measure units (SMUs). There are several ways in which the electrical current through a device under test (DUT) may be measured. FIG. 1 is a basic diagram of a conventional shunt ammeter 100 to simply sense a voltage across the resistor $R_S$ 102. In the example, $R_S$ 102 must be kept small to not cause a large burden voltage to the input signal. A low noise gain stage amplifier 104 amplifies the burden voltage so it can be measured. The impedance seen by the input is $R_S$.

Figure 2:
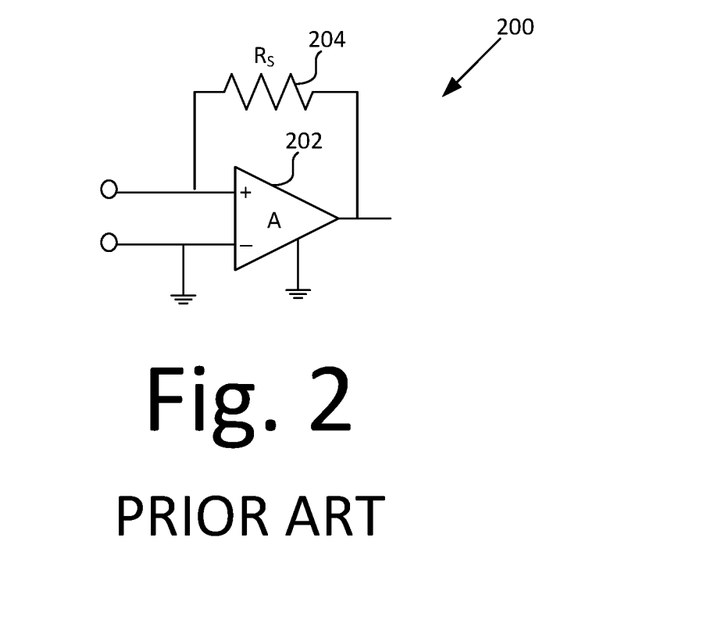
FIG. 2 illustrates an example of a conventional feedback ammeter configured with a high gain op-amp to pull the input circuit through a resistor $R_S$.

FIG. 2 is a basic circuit diagram of a feedback ammeter 200 having a high gain operational amplifier (op-amp) 202 to pull the input circuit through the resistor $R_S$ 204. The op-amp 202 keeps the burden voltage low because of the high DC gain (e.g., typically greater than 1 million). This allows the resistance of the resistor $R_S$ 204 to be larger, thus allowing the output signal to be larger. However, the high gain of the op-amp 202 begins to roll off at relatively low frequencies. This causes the burden voltage to increase at higher frequencies as well. If the input is capacitive, it can cause the feedback ammeter 200 to ring or even oscillate. The impedance seen at the input is $R_S/A$; therefore, as the gain rolls off at higher frequencies the impedance rolls up and the input looks inductive.

Figure 3:
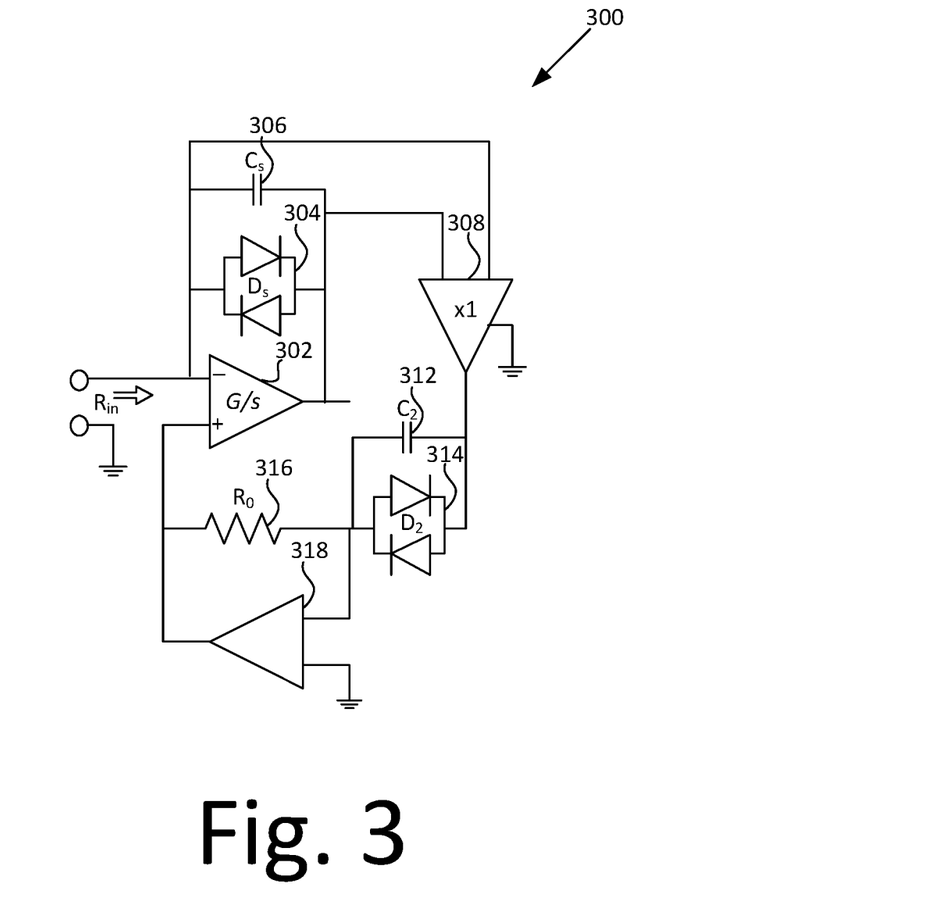
FIG. 3 illustrates a first example of a diode active shunt ammeter circuit in accordance with certain embodiments of the disclosed technology.

Embodiments of the disclosure address the various issues of the ammeters in FIGS. 1 and 2. FIG. 3 illustrates a first example of a diode active shunt ammeter circuit 300 in accordance with certain embodiments of the disclosed technology. An optional op-amp 302 can have a feedback path with a non-linear device $D_s$ 304 and a capacitor $C_s$ 306 electrically coupled between the output and the input of the op-amp 302. The non-linear device $D_s$ 304 and the capacitor $C_s$ 306 are in parallel. An input of a diff-amplifier 308 is electrically coupled to the feedback path, as well. The output of the diff-amplifier 308 is connected to an optional capacitor $C_2$ 312 and a non-linear device $D_2$ 314, which are in parallel. A resistor $R_0$ 316 and an amplifier 318 are both electrically coupled to the parallel capacitor 312 and the non-linear device 314, as well as the input of the op-amp 302. Capacitors $C_s$ 306 and $C_2$ 312 are either the capacitance of the non-linear devices $D_s$ 304 and $D_2$ 314, or may be added additional capacitance.

Although the non-linear devices 304 and 314 are each illustrated as diode pairs in the embodiments of FIG. 3, embodiments of the disclosure are not limited to diode pairs, but rather any non-linear device, such as, but not limited to, piece-wise linear circuits and bipolar transistors, may be used. In some embodiments, only a single diode may be used, rather than a pair of diodes, to measure current of one polarity.

In the embodiment of FIG. 3, the two non-linear devices $D_S$ 304 and $D_2$ 314 will each have a large $$\frac{\Delta V}{\Delta I}$$

(i.e., tangential resistance) when their electrical current is small, as well as a small tangential resistance when their electrical current is large. The tangential resistance of the non-linear device $D_2$ 314 divided by a resistance of resistor $R_0$ 316 sets the small signal gain acting on the tangential resistance of the non-linear device $D_S$ 304. This gain varies with electrical current flowing through the circuit 300. If $R_0 C_S$ is adjusted or selected to be equal to one over the gain bandwidth (G) of op-amp 302, then tangential resistance of the non-linear device $D_S$ 304 will equal the impedance of capacitor $C_S$ 306 at the same frequency that the gain of op-amp 302 begins to roll off from the gain set by the ratio of the tangential resistance of $D_2$ 314 and $R_0$ 316.

Thus, as the op-amp loses gain with increased frequency and the impedance in the feedback path of the op-amp 302, the non-linear device $D_S$ 304 in parallel with $C_S$ 306 is reducing at the same rate. The input impedance $R_{in}$ is thus constant across the frequency band of the op-amp and this relationship holds for all functional values of the input electrical current. The circuit 300 outputs the log of the input electrical current and can handle many decades of input electrical current while having a constant input impedance $R_{in}$.

This circuit 300 is based on the diode model shown in equations (1) and (2):

$$V_D = R_x i + \frac{kT}{q} \ln\left(\frac{i}{I_x} + 1\right) \tag{1}$$

$$\frac{dV_D}{di} = R_x + \frac{kT}{q}\left(\frac{1}{i + I_x}\right) \tag{2}$$

As shown in the following equations, based on the diode model in equations (1) and (2), and the circuit illustrated in FIG. 3, the input resistance is approximately equal to $R_0$, which means the input to the circuit is resistive, which provides stability for the circuit.

$$\left(\frac{dV_{Ds}}{di}\right) C_s = \frac{1}{G} \frac{\frac{dV_{D2}}{di}}{R_0} \tag{3}$$

$$\frac{dV_{Ds}}{di} \approx \frac{dV_{D2}}{di} \Rightarrow R_0 C_s \approx \frac{1}{G} \tag{4}$$

$$R_{in} = \left(\frac{dV_{Ds}}{di}\right) \frac{R_0}{\left(\frac{dV_{D2}}{di}\right)} \approx R_0 \tag{5}$$

During operation of the circuit of FIG. 3, the measurement for the electrical current can be taken across the non-linear device $D_S$ 304.

Figure 4:
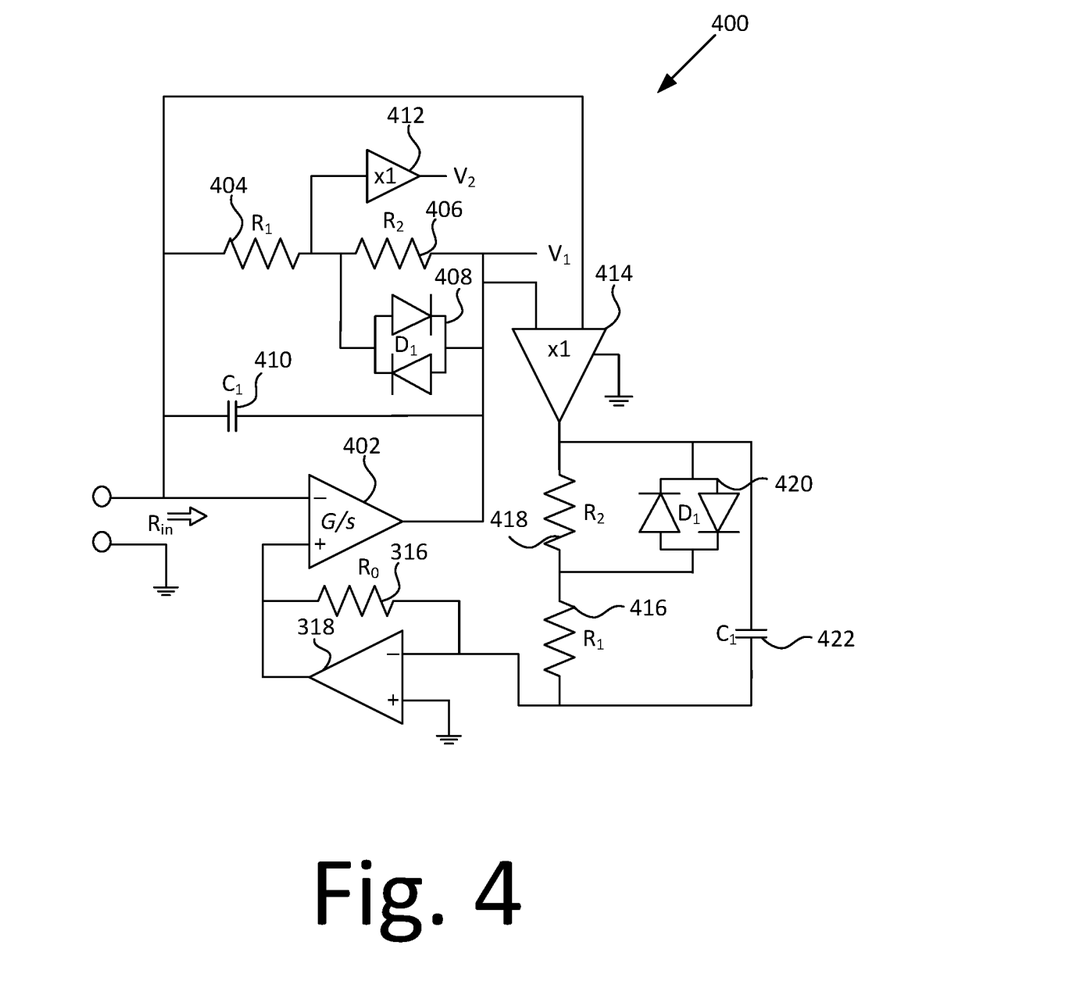
FIG. 4 illustrates a second example of a diode active shunt ammeter circuit in accordance with certain embodiments of the disclosed technology.

FIG. 4 illustrates a second example of a diode active shunt ammeter circuit 400 in accordance with certain embodiments of the disclosed technology. In the example, the circuit 400 may be a piecewise linear circuit. The circuit 400 includes an op-amp 402 which can have a feedback path. The feedback path can include two resistors $R_1$ 404 and $R_2$ 406 in series. Resistor $R_2$ 406 has a non-linear device $D_1$ 408 in parallel with it. The feedback path also includes a capacitor $C_1$ 410 in parallel with the two resistors $R_1$ 404 and $R_2$ 406.

An amplifier 412 may be electrically coupled between the resistors $R_1$ 404 and $R_2$ 406 to determine a voltage at that point for the electrical current measurement. A voltage may also be measured at $V_1$ in the circuit.

An input of a differential amplifier (diff-amplifier) 414 is electrically coupled to the feedback path, as well. The output of the diff-amplifier 414 is connected to a circuit which is identical to the feedback path. That is, the circuit includes resistors $R_1$ 416 and $R_2$ 418, a non-linear device $D_1$ 420, and a capacitor $C_1$ 422, which are identical and arranged identically to the resistors $R_1$ 404 and $R_2$ 406, the non-linear device $D_1$ 408, and a capacitor $C_1$ 410. A resistor $R_0$ 422 and an amplifier 424 are both electrically coupled to the capacitor 422 and resistor 418, as well as the input of the op-amp 402.

Similar to the circuit 300 in FIG. 3, circuit 400 also includes resistor $R_0$ 316 and amplifier 318, and as such, these components will not be discussed further herein with respect to FIG. 4. Similar to circuit 300 illustrated in FIG. 3, in the example circuit 400:

$$R_0 C_1 \approx \frac{1}{G} \tag{6}$$

$$R_{in} \approx R_0 \tag{7}$$

In circuit 400 the non-linear devices $D_1$ 408 and 420 are each a clamping device, such as a pair of diodes, as illustrated in FIG. 4, or a switch. Each of the resistors $R_1$ 404 and $R_2$ 406 have a different resistance. Generally, diodes turn on when a voltage is greater than a threshold. Accordingly, during operation of the circuit 400, if the electrical current is large enough that the non-linear device $D_1$ 408 turns on, the resistor $R_2$ 406 is saturated and then the voltage across $R_1$ is an accurate measurement of the electrical current. If the electrical current is low enough that the non-linear device $D_1$ 408 does not turn on, then the voltage across $R_2$ is a more accurate measurement of the electrical current. The voltages $V_1$ and $V_2$ can be read to determine the electrical current.

Figure 5:
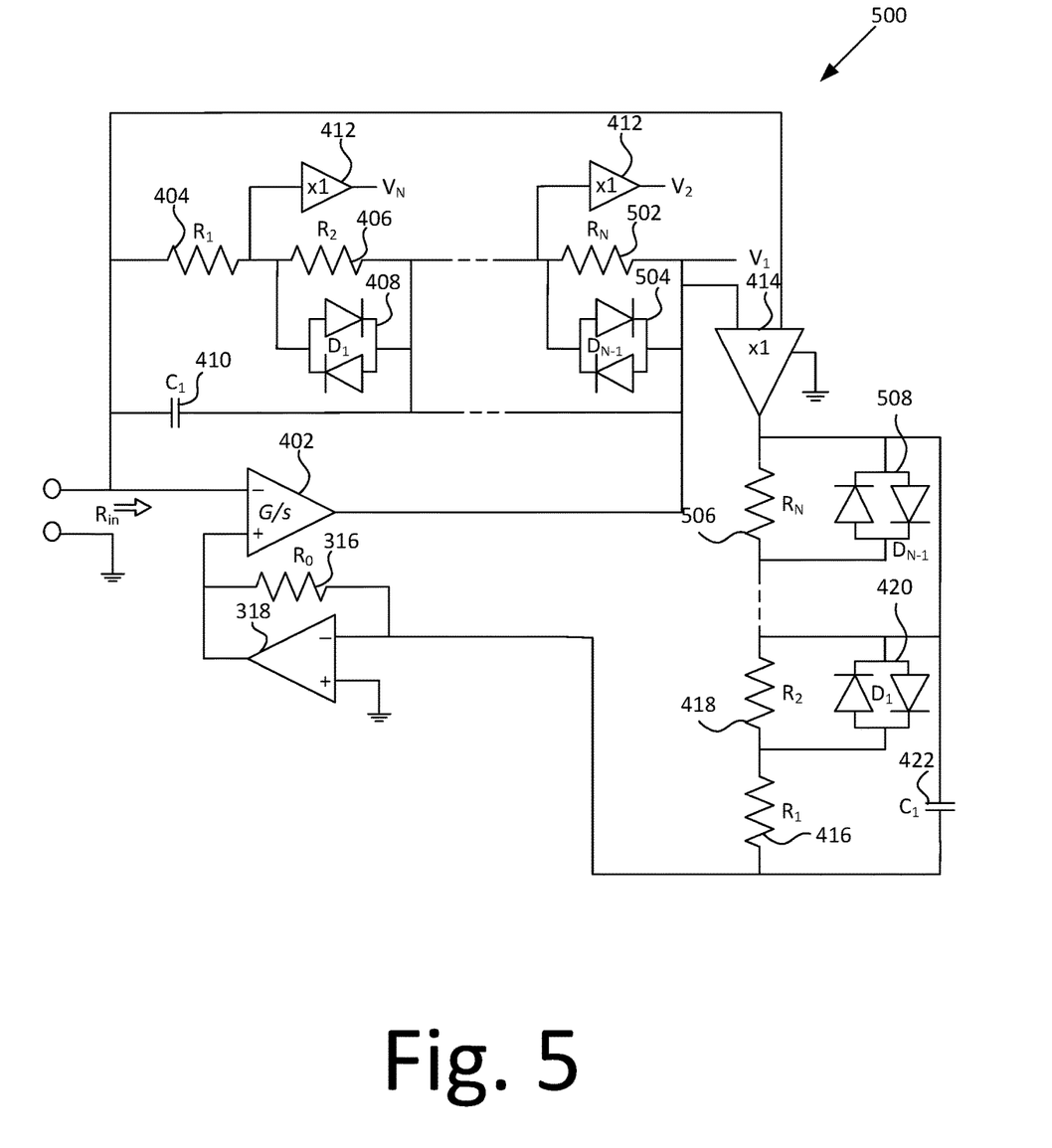
FIG. 5 illustrates an example of the diode active shunt ammeter of FIG. 4 with multiple ranges.

While the example circuit 400 only includes two ranges, the circuit may be expanded to include multiple ranges, as illustrated in FIG. 5. The circuit 500 may have N number of ranges, where N is an integer. Components in FIG. 5 that are similar to components in FIG. 4 are given the same reference number and not discussed further herein with respect to FIG. 5.

In FIG. 5, rather than only having two resistors $R_1$ 404 and $R_2$ 406, N number of resistors may be provided, each having a clamping device in parallel with the resistor. For example, FIG. 5 illustrates resistor $R_N$ 502 with a non-linear device $D_{N-1}$ 504 in parallel. Since the circuit after the diff-amplifier 414 is the same as the feedback path, there is also N number of resistors provided, each having a clamping device in parallel, electrically coupled to the output of the diff-amplifier 414. For example, FIG. 5 illustrates resistor N $R_N$ 506 with a non-linear device $D_{N-1}$ 508 in parallel.

Each of resistors R₁ 404, R₂ 406, and R_N 502 have a different resistance. For example, assuming N is three, R₁ 404 may be 10 ohms, R₂ 406 may be 100 ohms, and R₃ may be 1000 ohms. For this example, it also assumed that the voltage limiting devices D₁ 408 and D_{N-1} 504 turn on at 0.6 V. If the electrical current is 1 mA, there would be 1 V present across R₃ 502 and the non-linear device D₂ 504 would be turned on, such that the electrical current is routed around the resistor R₃ 502. Since resistor R₁ 404 is only 10 ohms, it's a noisier measurement, and the electrical current measurement may be taken based on the voltage across R₂ 406. If the electrical current jumps to 100 mA, then R₁ 404 gives a volt, and the other two resistors R₂ 406 and R₃ 502 would be saturated, and the voltage across R₁ 404 can be used to determine the electrical current. This creates a logarithmic behavior for the circuit 500 and can create a more accurate electrical current measurement at all different magnitudes of electrical currents. In some embodiments, the resistance of the resistors in the circuit may be chosen in decade multiples, as illustrated above.

Figure 6:
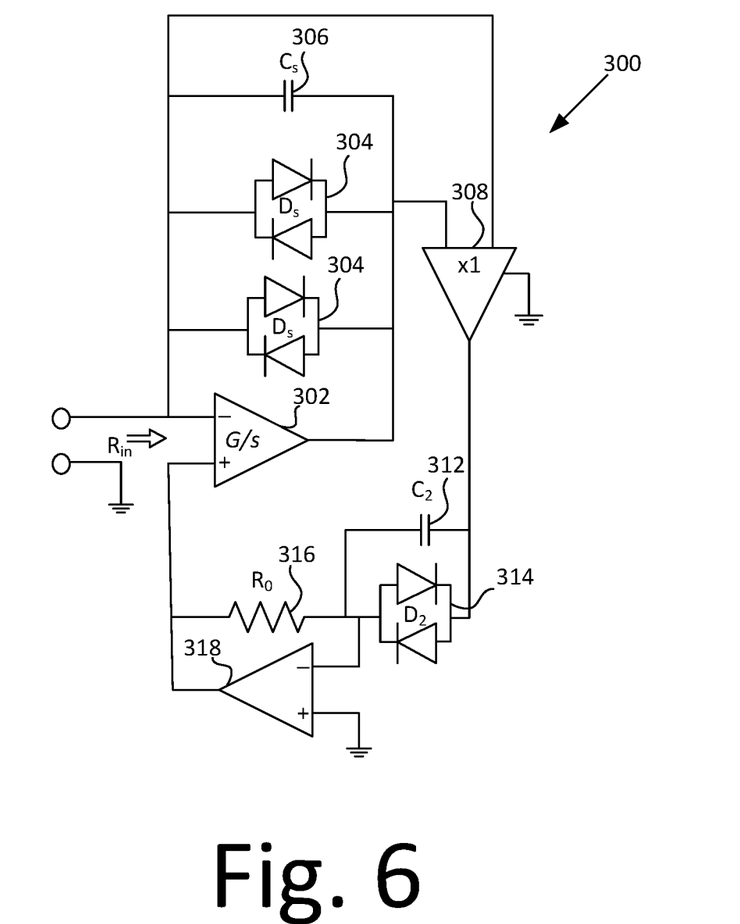
FIG. 6 illustrates a third example of a diode active shunt ammeter circuit in accordance with certain embodiments of the disclosed technology.

FIG. 6 illustrates another example of a diode active shunt ammeter circuit 600 in accordance with certain embodiments of the disclosed technology. This example includes components similar to those discussed above with respect to FIG. 3. Accordingly, these components are given the same reference number and are not discussed in detail further herein.

In the circuit 600, more non-linear devices D_s 304 may be provided in the feedback path, than the number of non-linear devices D₂ 314. In the example shown in FIG. 3, two non-linear devices D_s 304 are provided and one non-linear device D₂ 314 is provided. This causes the the relationship between the input impedance of the circuit R_{in} to be a ratio of R₀. For example in circuit 600, using the diode model illustrated in equations (1) and (2) above, R_{in} is equal to half of R₀, as illustrated below in equations (8)-(11):

$$\frac{1}{2}\left(\frac{dV_{Ds}}{di}\right)C_s = \frac{1}{G}\frac{\frac{dV_{D2}}{di}}{R_0} \quad (8)$$

$$\frac{dV_{Ds}}{di} \approx \frac{dV_{D2}}{di} \quad (9)$$

$$\frac{1}{2}R_0 C_s \approx \frac{1}{G} \quad (10)$$

$$R_{in} = \frac{1}{2}\left(\frac{dV_{Ds}}{di}\right)\frac{R_0}{\left(\frac{dV_{D2}}{di}\right)} \approx \frac{R_0}{2} \quad (11)$$

Embodiments of the disclosure, however, are not limited to the embodiment shown in FIG. 6. A different number of non-linear devices D_S 304 and non-linear devices D₂ 314 may be provided to change the ratio R_{in} to R₀. Further, the non-linear devices D_S 304 do not have to be in parallel, but rather may be provided in series.

FIGS. 7-10 illustrate other embodiments of an active shunt ammeter 700, 800, 900, and 1000 respectively according to certain embodiments of the disclosure. Components of the active shunt ammeters 700, 800, 900, and 1000 are similar to those discussed above with respect to FIG. 3, but arranged in a different circuit. As such, components are given the same reference numbers.

Figure 7:
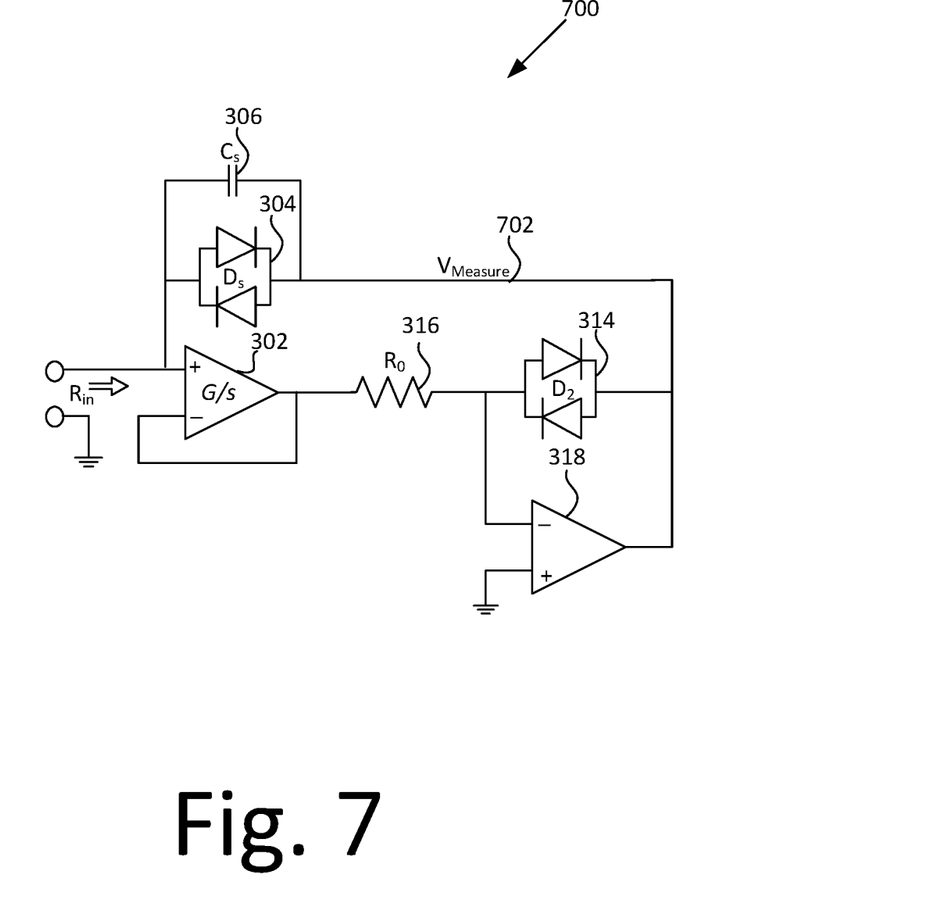
FIG. 7 illustrates another example of an active shunt ammeter in accordance with some embodiments of the disclosed technology.

The active shunt ammeter 700 of FIG. 7 may include a first feedback path to an inverting input of the op-amp 302, and a second feedback path that includes resistor R₀ 316 and amplifier 318, as well as a non-linear device D_s 314 electrically coupled to the resistor 316 as well as to the non-linear device D_s 304 and capacitor 306. The non-linear device D_s 304 and the capacitor 306 are electrically coupled to an input of the op-amp 302. In this embodiment, a voltage may be measured at V_{Measure} 702 to determine the current flowing through the non-linear device D_s 304. Similar to FIG. 3, if R₀C_s is set or selected to be one over the gain bandwidth, then the input impedance R_{in} is approximately equal to R₀.

Figure 8:
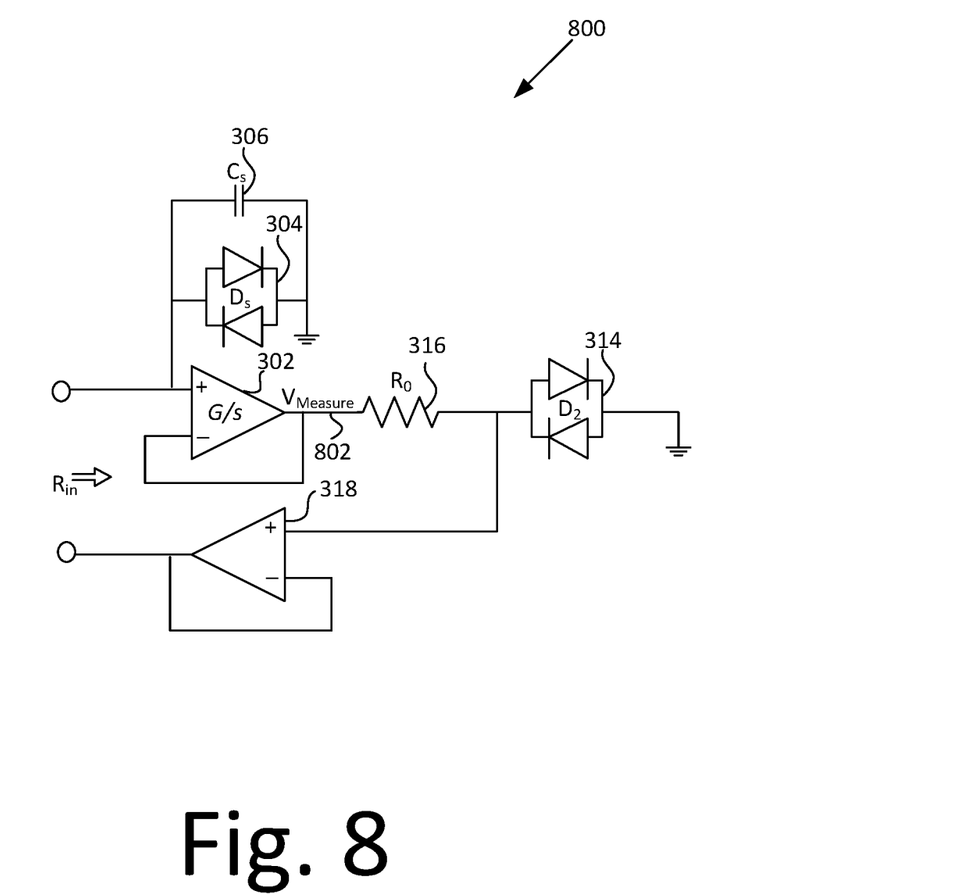
FIG. 8 illustrates another example of an active shunt ammeter in accordance with some embodiments of the disclosed technology.

Similar to the active shunt ammeter of FIG. 7, in the active shunt ammeter 800 of FIG. 8, the op-amp 302 is electrically coupled to the resistor 316, which in turn is electrically coupled to the non-linear device D₂ 314 and the amplifier 318. The amplifier 318 includes a negative feedback path. The non-linear device D_s 304 is connected to an input of the op-amp 302, and is in parallel with capacitor C_s 306. In this embodiment, the voltage may be measured at V_{Measure} 802 and used to determine the current running through a connected device under test. Similar to FIG. 3, if R₀C_s is set or selected to be one over the gain bandwidth, then the input impedance R_{in} is approximately equal to R₀.

Figure 9:
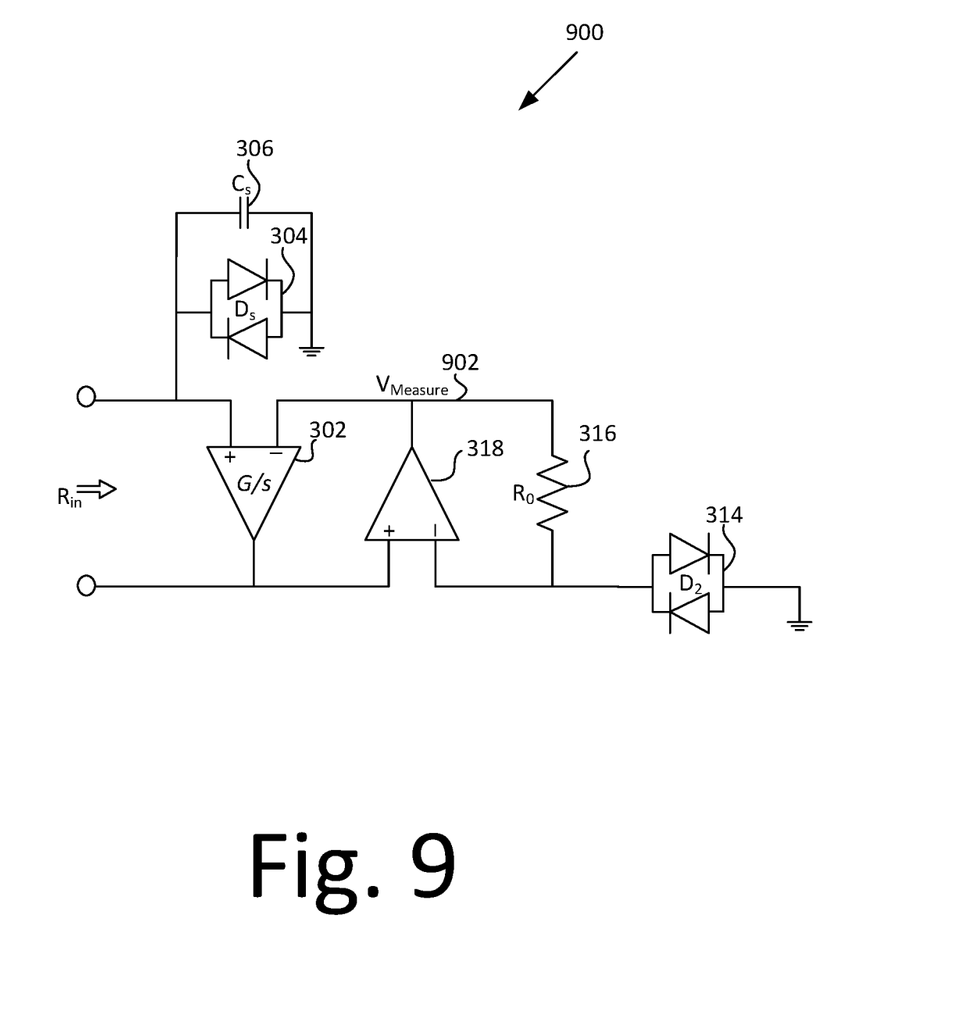
FIG. 9 illustrates another example of an active shunt ammeter in accordance with some embodiments of the disclosed technology.

Active shunt ammeter 900, similar to active shunt ammeter 800, may include the non-linear device D_s 304 in parallel with a capacitor C_s 306, which are electrically coupled to an input of the op-amp 302. Also electrically coupled to an input of the op-amp 302 is the resistor 316 and an output of amplifier 318. An input of the amplifier 318 is electrically coupled to the resistor 306 and the non-linear device D₂ 314, which is also electrically coupled to ground. The other input of the amplifier 318 is connected to the output of the op-amp 302.

In active shunt ammeter 900, a voltage measurement may be taken at V_{Measure} 902 to determine a current. Similar to the other active shunt ammeters, if R₀C_s is set or selected to be one over the gain bandwidth, then the input impedance R_{in} is approximately equal to R₀.

Figure 10:
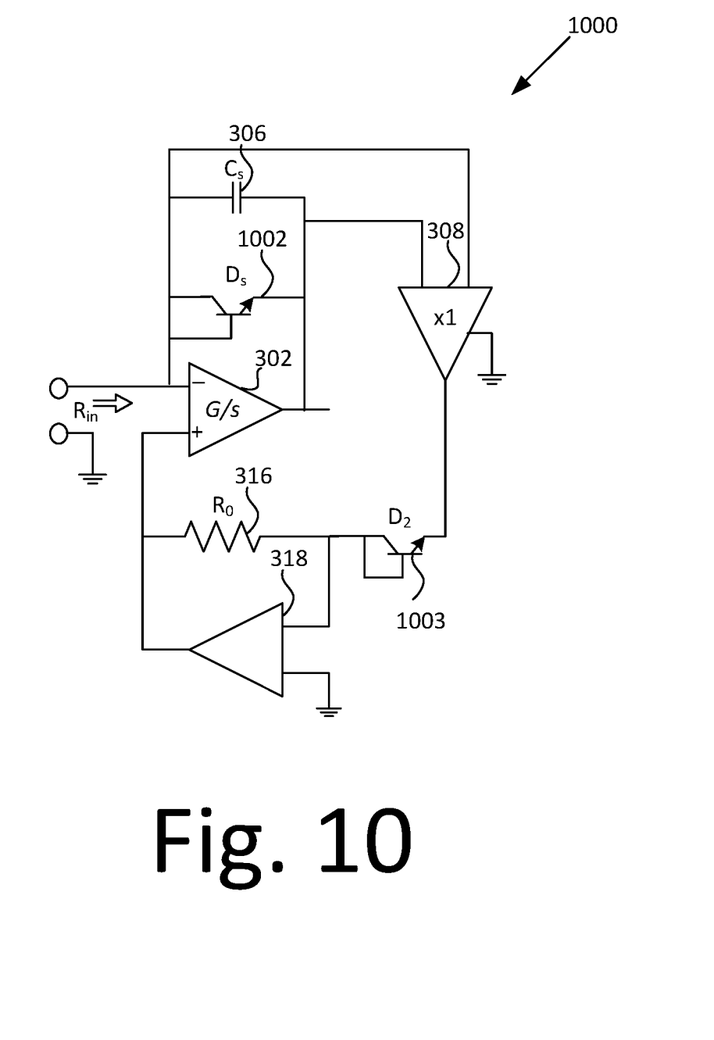
FIG. 10 illustrates an example of an active shunt ammeter having transistors as non-linear devices in accordance with some embodiments of the disclosed technology.

Active shunt ammeter 1000 illustrates the embodiment shown in FIG. 3, when pair of diodes D_s 304 and D₂ 314 illustrated in FIG. 3 are instead transistors 1002 and 1003. FIG. 10 also does not include the optional capacitor C₂ 312. The operation of the active shunt ammeter 1000 operates substantially equivalently to the embodiment shown in FIG. 3 and therefore will not be described in further detail. Such transistors may be used in any of the embodiment discussed above, as the non-linear devices.

Figure 11:
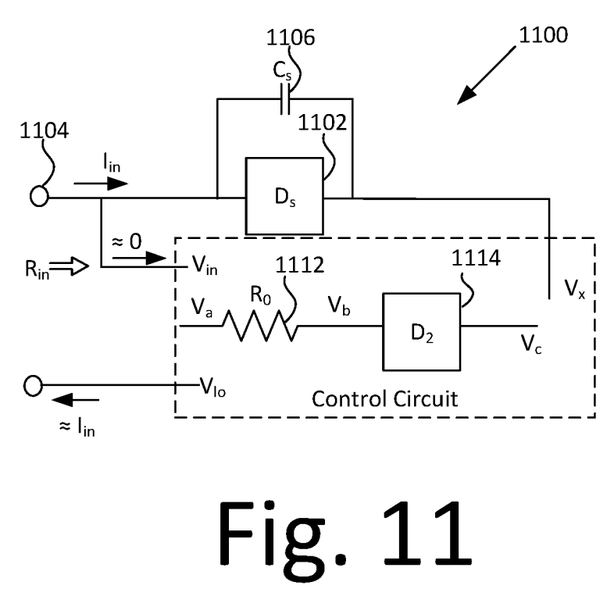
FIG. 11 illustrates an example of an active shunt ammeter according to some embodiments of the disclosed technology.

FIG. 11 illustrates an example of a simplified circuit 1100 based on the embodiments discussed above. For example, as seen in FIG. 11, a non-linear device D_s 1102 is connected to an input 1104 of the ammeter 1100. A capacitor C_s 1106 is illustrated in FIG. 11. The capacitor C_s 1106 may represent the parasitic capacitance of the non-linear device D₂ 1102. In some embodiments, a capacitor may be added for capacitor C_s 1106. Knowing the value of the capacitance of C_s 1106 may allow the ammeter 1100 to be designed to have an input impedance that is constant versus frequency. The input 1104 is also connected to a control circuit 1110. The control circuit 1110 may include a resistor R₀ 1112 in series with a non-linear device D₂ 1114. As discussed in detail, above, other components may be provided in the ammeters to provide different functions and variations of the circuits.

In FIG. 11, the input current, I_{in}, flows through the non-linear device D_s 1106. The control circuit 1110 forces the voltage across the non-linear device D_s 1106, which is approximately equal to V_x-V_{in}, across the non-linear device D₂ 1114. The current that flows through the non-linear device D₂ 1114 also flows through the resistor R₀ 1112. The control circuit 1100 controls the voltages $V_x$ and $V_{lo}$ such that the difference between the voltage $V_{in}$ and the voltage $V_{lo}$ equals the voltage across the resistor $R_o$ 1112 (i.e., $V_b - V_a$). This results in the input resistance, $R_{in}$, being proportional to the resistor $R_o$ 1112.

Figure 12:
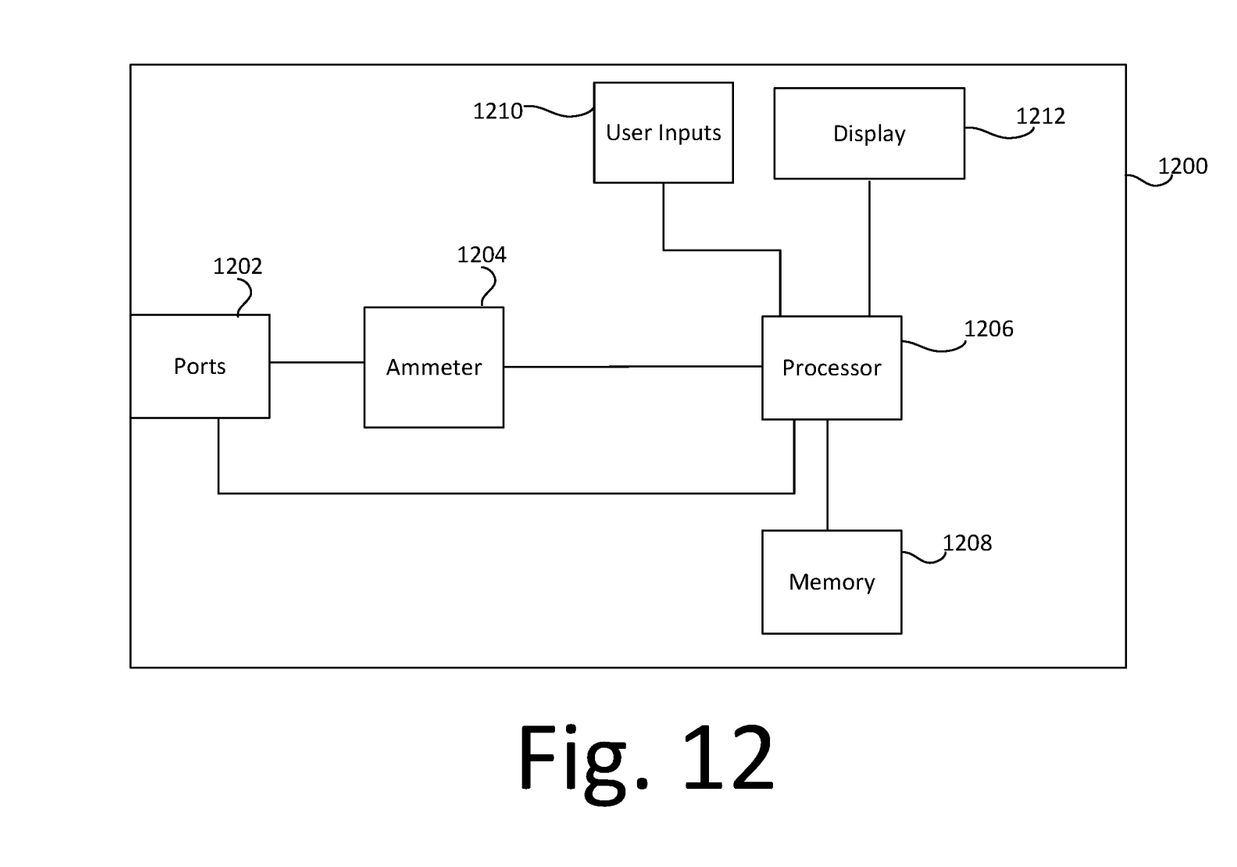
FIG. 12 illustrates a block diagram of a test and measurement unit according to some embodiments of the disclosed technology.

FIG. 12 illustrates a block diagram of a test and measurement instrument according to some embodiments of the disclosure. As will readily be understood by one skilled in the art, the test and measurement instrument 1200 may include additional components not illustrated in FIG. 12.

The test and measurement instrument 1200 includes a one or more ports 1202 which may be any electrical signaling medium. The test and measurement instrument 1200 may be any device which may measure a current, such as, but not limited to, a source measure unit or a digital multi-meter, as discussed above. Ports 1202 may include receivers, transmitters, and/or transceivers. The ports 1202 may be coupled to an ammeter 1204, which may be any of the ammeters 300, 400, 500, or 600, or a source, if the test and measurement instrument 1200 is a source measure unit. Although only one processor 1206 is shown in FIG. 12 for ease of illustration, as will be understood by one skilled in the art, multiple processors 1206 of varying types may be used in combination, rather than a single processor 1206. The processor 1206 may be electrically coupled to the ammeter 1204 to assist with measuring, displaying, and/or storing the current of a connected device under test.

The one or more processors 1206 may be configured to execute instructions from memory 1208 and may perform any methods and/or associated steps indicated by such instructions. Memory 1208 may be implemented as processor cache, random access memory (RAM), read only memory (ROM), solid state memory, hard disk drive(s), or any other memory type. Memory 1208 acts as a medium for storing data, computer program products, and other instructions.

User inputs 1210 are coupled to the one or more processors 1206. User inputs 1210 may include a keyboard, mouse, trackball, touchscreen, and/or any other controls employable by a user to with a GUI on the display 1212. The display 1212 may be a digital screen, a cathode ray tube based display, or any other monitor to display waveforms, measurements, and other data to a user. While the components of test and measurement instrument 1200 are depicted as being integrated within test and measurement instrument 1200, it will be appreciated by a 1200 of ordinary skill in the art that any of these components can be external to test instrument 1200 and can be coupled to test instrument 1200 in any conventional manner (e.g., wired and/or wireless communication media and/or mechanisms). For example, in some embodiments, the display 1212 may be remote from the test and measurement instrument 1200.

The embodiments discussed herein allow for a wide dynamic range of electrical currents with accuracy at all electrical current levels. The embodiments may allow a user to accurately measure a device at both low and high electrical currents, without having to change the ammeter. For example, if a device were to suddenly receive a large electrical current, while previously receiving a low electrical current, the ammeter of the embodiments disclosed herein are capable of measuring both the low electrical currents and the high electrical currents with accuracy.

In this disclosure, the singular forms "a," "an," and "the" include plural referents unless the context dictates otherwise. The term "or" is meant to be inclusive and means either, any, several, or all of the listed items. The terms "comprises," "comprising," "includes," "including," or other variations thereof, are intended to cover a non-exclusive inclusion such that a process, method, or product that comprises a list of elements does not necessarily include only those elements, but may include other elements not expressly listed or inherent to such a process, method, article, or apparatus. Relative terms, such as "about," "approximately," "substantially," and "generally," are used to indicate a possible variation of ±10% of a stated or understood value.

The aspects of the present disclosure are susceptible to various modifications and alternative forms. Specific aspects have been shown by way of example in the drawings and are described in detail herein. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is an ammeter, comprising a resistor; an input having an input resistance equal to approximately to a resistance of the resistor; a first non-linear device in series with the resistor; and a second non-linear device electrically coupled to the input.

Example 2 is the ammeter of example 1, wherein each of the first non-linear device and the second non-linear device is a pair of diodes in parallel.

Example 3 is the ammeter of either one of examples 1 and 2, wherein each of the first non-linear device and the second non-linear device is a clamping circuit.

Example 4 is the ammeter of example 3, wherein the clamping circuit is a switch or a pair of diodes in parallel.

Example 5 is the ammeter of any one of examples 1-4, further comprising an operational amplifier having an input and an output, the resistor electrically coupled to the input of the operational amplifier and the second non-linear device electrically coupled to the output of the operational amplifier; and a feedback path electrically coupled between the output and the input of the operational amplifier, the feedback path including the first non-linear device.

Example 6 is the ammeter of example 5, further comprising a first capacitor in the feedback path and a second capacitor electrically coupled to the output of the amplifier, the first capacitor and the second capacitor having approximately equal capacitances.

Example 7 is the ammeter of either one of examples 5 or 6, wherein the feedback path includes a third non-linear device.

Example 8 is the ammeter of example 7, wherein the third non-linear device is in series with the first non-linear device.

Example 9 is the ammeter of any one of examples 5-8, wherein the resistor is a first resistor, and the feedback path further includes: a second resistor; and a third resistor in series with the second resistor and parallel to the first non-linear device.

Example 10 is the ammeter of example 9, further including: a fourth resistor electrically coupled to the output of the amplifier and parallel to the first non-linear device, and a fifth resistor electrically coupled to the first resistor and the fourth resistor and in series with the fourth resistor.

Example 11 is the ammeter of any one of examples 1-10, wherein during operation of the ammeter, an input resistance of the ammeter is approximately equal to a resistance of the resistor across all frequencies.

Example 12 is a test and measurement device, comprising: an input port configured to receive an electrical current from a device under test; and the ammeter of claim 1 configured to measure the electrical current from the device under test.

Example 13 is an ammeter, comprising an operational amplifier having a first input, a second input, and an output, the operational amplifier having an input impedance at the first input and the second input; a feedback path electrically coupled between the output and the first input of the operational amplifier, the feedback path including a first non-linear device; an amplifier electrically coupled to the input of the operational amplifier and the output of the operational amplifier; a second non-linear device electrically coupled to an output of the amplifier; and a resistor electrically coupled between the second capacitor and the second input of the operational amplifier, a resistance of the resistor being approximately equal or a multiple of the input impedance.

Example 14 is the ammeter of example 13, wherein the feedback path includes a third non-linear device.

Example 15 is the ammeter of example 14, wherein the third non-linear device is in series with the first non-linear device.

Example 16 is the ammeter of any one of examples 13-15, wherein the resistor is a first resistor, and the feedback path further includes a second resistor; and a third resistor in series with the second resistor and parallel to the first non-linear device.

Example 17 is the ammeter of example 16, further including a fourth resistor electrically coupled to the output of the amplifier and parallel to the first non-linear device, and a fifth resistor electrically coupled to the first resistor and the fourth resistor and in series with the fourth resistor.

Example 18 is a method of measuring current flowing through a device under test, the method comprising: receiving an input signal representing the current flowing through the device under test; generating an output voltage across a first non-linear device; and providing a control circuit having a second non-linear device in series with a resistor, the control circuit configured to force a voltage across the second non-linear device equal to the output voltage and control an input resistance proportional to a resistance of the resistor.

Example 19 is the method of example 18, wherein the output voltage is generated across the first non-linear device in a feedback path of an operational amplifier.

Example 20 is the method of either one of examples 18 and 19, wherein a current that flows through the first non-linear device also flow through the resistor.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. An ammeter, comprising:
    a resistor;
    an ammeter input having an input resistance equal to approximately a resistance of the resistor;
    a first non-linear device in series with the resistor;
    a second non-linear device electrically coupled to the ammeter input;
    an operational amplifier having a first input, a second input, and an output, the resistor electrically coupled to the first input of the operational amplifier; and
    a feedback path electrically coupled between the output and the second input of the operational amplifier, the feedback path including the second non-linear device.

2. The ammeter of claim 1, wherein each of the first non-linear device and the second non-linear device is a pair of diodes in parallel.

3. The ammeter of claim 1, wherein each of the first non-linear device and the second non-linear device is a clamping circuit.

4. The ammeter of claim 3, wherein the clamping circuit is a switch or a pair of diodes in parallel.

5. The ammeter of claim 1, further comprising a first capacitor in the feedback path and a second capacitor electrically coupled to the output of the operational amplifier, the first capacitor and the second capacitor having approximately equal capacitances.

6. The ammeter of claim 1, wherein the feedback path includes a third non-linear device.

7. The ammeter of claim 6, wherein the third non-linear device is in series with the first non-linear device.

8. The ammeter of claim 1, wherein the resistor is a first resistor, and the feedback path further includes:
    a second resistor; and
    a third resistor in series with the second resistor and parallel to the first non-linear device.

9. The ammeter of claim 8, further including:
    a fourth resistor electrically coupled to the output of the amplifier and parallel to the first non-linear device,
    a fifth resistor electrically coupled to the first resistor and the fourth resistor and in series with the fourth resistor.

10. The ammeter of claim 1, wherein during operation of the ammeter, the input resistance is approximately equal to the resistance of the resistor across all frequencies.

11. A test and measurement device, comprising:
    an input port configured to receive an electrical current from a device under test; and
    the ammeter of claim 1 configured to measure the electrical current from the device under test.

12. An ammeter, comprising:
    an operational amplifier having a first input, a second input, and an output, the operational amplifier having an input impedance at the first input and the second input;
    a feedback path electrically coupled between the output and the first input of the operational amplifier, the feedback path including a first non-linear device;
    an amplifier electrically coupled to the first input of the operational amplifier and the output of the operational amplifier;
    a second non-linear device electrically coupled to an amplifier output of the amplifier; and
    a resistor electrically coupled between the amplifier output and the second input of the operational amplifier, a resistance of the resistor being approximately equal or a multiple of the input impedance.

13. The ammeter of claim 12, wherein the feedback path includes a third non-linear device.

14. The ammeter of claim 13, wherein the third non-linear device is in series with the first non-linear device.

15. The ammeter of claim 12, wherein the resistor is a first resistor, and the feedback path further includes:
    a second resistor; and
    a third resistor in series with the second resistor and parallel to the first non-linear device.

16. The ammeter of claim 15, further including:
    a fourth resistor electrically coupled to the output of the amplifier and parallel to the first non-linear device,
    a fifth resistor electrically coupled to the first resistor and the fourth resistor and in series with the fourth resistor.

17. A method of measuring current flowing through a device under test, the method comprising:
    receiving an input signal representing current flowing through the device under test;
    generating an output voltage across a first non-linear device; and
    providing a control circuit having a second non-linear device in series with a resistor, the control circuit configured to force a voltage across the second non-linear device equal to the output voltage and control an input resistance proportional to a resistance of the resistor.

18. The method of claim 17, wherein the output voltage is generated across the first non-linear device in a feedback path of an operational amplifier.

19. The method of claim 17, wherein current that flows through the first non-linear device also flows through the resistor.

* * * * *